United States Patent
Nam et al.

(10) Patent No.: US 9,568,825 B2
(45) Date of Patent: Feb. 14, 2017

(54) HARDMASK COMPOSITION AND METHOD OF FORMING PATTERNS USING THE HARDMASK COMPOSITION

(71) Applicant: SAMSUNG SDI CO., LTD., Yongin-si, Gyeonggi-do (KR)

(72) Inventors: Youn-Hee Nam, Suwon-si (KR); Hea-Jung Kim, Suwon-si (KR); Hyun-Ji Song, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/748,911

(22) Filed: Jun. 24, 2015

(65) Prior Publication Data
US 2016/0017174 A1   Jan. 21, 2016

(30) Foreign Application Priority Data
Jul. 15, 2014   (KR) .......................... 10-2014-0089367

(51) Int. Cl.
*G03F 7/11* (2006.01)
*H01L 21/02* (2006.01)
(Continued)

(52) U.S. Cl.
CPC ................ *G03F 7/11* (2013.01); *C08G 61/02* (2013.01); *C09D 165/00* (2013.01); *C09D 165/02* (2013.01); *G03F 7/094* (2013.01); *G03F 7/40* (2013.01); *H01L 21/0276* (2013.01); *H01L 21/02126* (2013.01); *H01L 21/02304* (2013.01); *H01L 21/31116* (2013.01); *H01L 21/31144* (2013.01); *C08G 2261/146* (2013.01); *C08G 2261/148* (2013.01);
(Continued)

(58) Field of Classification Search
CPC .............. G03F 7/11; G03F 7/40; G03F 7/091; G03F 7/094; H01L 21/0274; H01L 21/0276; H01L 21/02126; H01L 21/02304; H01L 21/31116; H01L 21/31144; C09D 165/02; C08G 61/10
USPC ....... 430/311, 313, 314, 317, 322, 325, 329, 430/330, 331, 272.1, 271.1; 524/611; 528/153, 206; 438/694
See application file for complete search history.

(56) References Cited

U.S. PATENT DOCUMENTS 8,298,747 B2 * 10/2012 Minegishi .............. C08G 69/26
430/270.1
8,450,048 B2 * 5/2013 Hatakeyama ........... G03F 7/095
427/386
(Continued)

FOREIGN PATENT DOCUMENTS

| CN | 101560290 A | 10/2009 |
| CN | 101934222 A | 1/2011 |

(Continued)

*Primary Examiner* — Amanda C Walke
(74) *Attorney, Agent, or Firm* — Lee & Morse, P.C.

(57) ABSTRACT

A hardmask composition includes a polymer including a moiety represented by the following Chemical Formula 1 and a solvent.

[Chemical Formula 1]

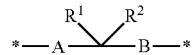

In the Chemical Formula 1,
A, B, $R^1$ and $R^2$ are the same as defined in the detailed description.

11 Claims, 1 Drawing Sheet

(51) Int. Cl.
*H01L 21/311* (2006.01)
*H01L 21/027* (2006.01)
*G03F 7/09* (2006.01)
*G03F 7/40* (2006.01)
*C09D 165/02* (2006.01)
*C08G 61/02* (2006.01)
*C09D 165/00* (2006.01)

(52) U.S. Cl.
CPC ............ *C08G 2261/1424* (2013.01); *C08G 2261/3424* (2013.01); *C08G 2261/45* (2013.01); *C08G 2261/72* (2013.01); *C08G 2261/90* (2013.01)

(56) References Cited

U.S. PATENT DOCUMENTS

| | | | | |
|---|---|---|---|---|
| 8,952,121 B2* | 2/2015 | Paulasaari | ............ | C08G 8/02 524/114 |
| 9,230,827 B2* | 1/2016 | Nonaka | ............ | G03F 7/094 |
| 2013/0280913 A1* | 10/2013 | Shinjo | ............ | C09D 139/04 438/694 |
| 2015/0274622 A1* | 10/2015 | Kim | ............ | C07C 39/14 216/49 |

FOREIGN PATENT DOCUMENTS

| | | |
|---|---|---|
| CN | 103059270 A | 4/2013 |
| JP | 2012/077295 A | 4/2012 |
| JP | 5229278 B2 | 3/2013 |
| KR | 10-2006-0116133 A | 11/2006 |
| KR | 10-2006-0132070 | 12/2006 |
| KR | 10-0819162 B1 | 3/2008 |
| KR | 10-2008-0107208 A | 12/2008 |
| KR | 10-2008-0107210 A | 12/2008 |
| KR | 10-2012-0073819 A | 7/2012 |
| KR | 10-2013-0026912 A | 3/2013 |
| KR | 10-2013-0130005 | 11/2013 |
| KR | 10-2014-0038809 A | 3/2014 |
| KR | 10-2014-0039423 A | 4/2014 |
| TW | 482764 B | 4/2002 |
| WO | WO 2012/077640 A1 | 6/2012 |

* cited by examiner

HARDMASK COMPOSITION AND METHOD OF FORMING PATTERNS USING THE HARDMASK COMPOSITION

CROSS-REFERENCE TO RELATED APPLICATION

Korean Patent Application No. 10-2014-0089367, filed on Jul. 15, 2014, in the Korean Intellectual Property Office, and entitled: "Hardmask Composition and Method of Forming Patterns Using the Hardmask Composition," is incorporated by reference herein in its entirety.

BACKGROUND

1. Field

Embodiments relate to a hardmask composition and a method of forming a pattern by using the hardmask composition.

2. Description of the Related Art

Recently, the semiconductor industry has developed an ultra-fine technique having a pattern of several to several tens of nanometers in size. Effective lithographic techniques are important for such ultrafine techniques.

A general lithographic technique includes providing a material layer on a semiconductor substrate; coating a photoresist layer thereon; exposing and developing the same to provide a photoresist pattern; and etching the material layer using the photoresist pattern as a mask.

SUMMARY

Embodiments are directed to a hardmask composition, including a polymer including a moiety represented by the following Chemical Formula 1, and a solvent,

[Chemical Formula 1]

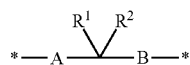

In the Chemical Formula 1,

A and B may independently be substituted or unsubstituted aromatic ring group, and $R^1$ and $R^2$ may independently be fluorine, a hydroxy group, a substituted or unsubstituted aromatic ring group, or a combination thereof.

The A and B may independently be a substituted or unsubstituted C6 to C50 arylene group.

The A and B may independently be one of the groups listed in the Group 1 and Group 2:

[Group 1]

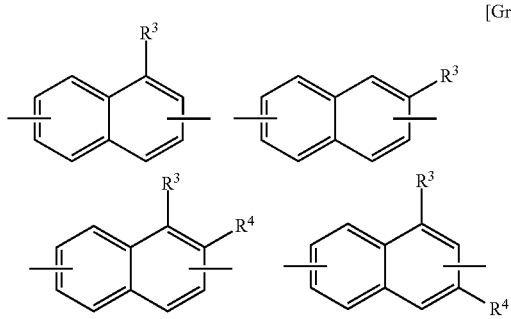

-continued

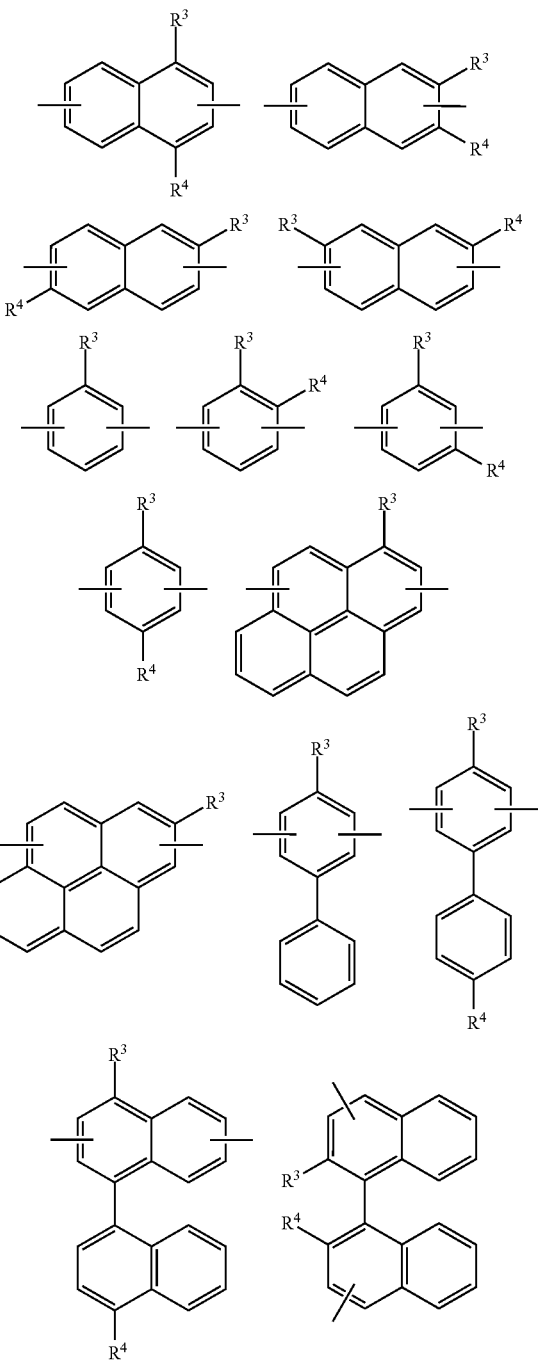

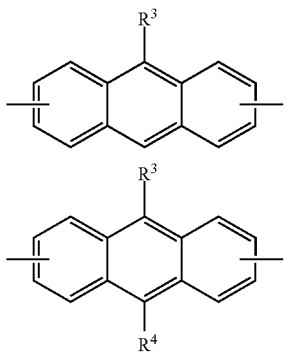

-continued

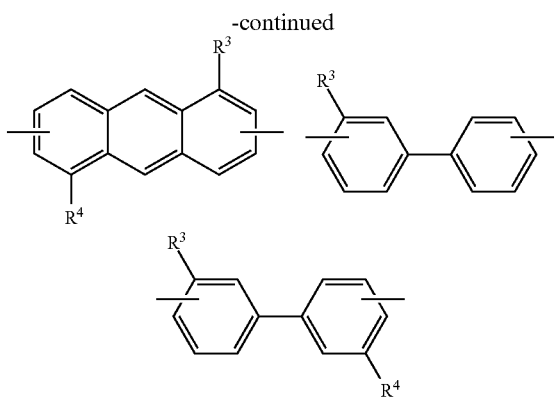

In the Group 1,

R³ and R⁴ may independently be hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof,

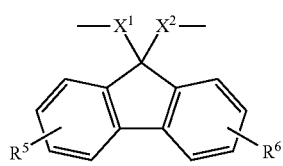

[Group 2]

In the Group 2, $X^1$ and $X^2$ may independently be one of groups listed in the Group 1, and $R^5$ and $R^6$ may independently be hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

At least one of the A and B may be a substituted or unsubstituted polycyclic aromatic ring group.

The polymer may be represented by the following Chemical Formula 2:

[Chemical Formula 2]

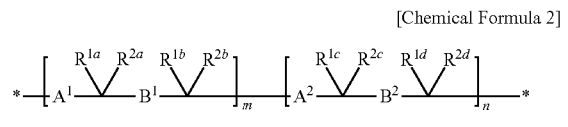

In the Chemical Formula 2, $A^1$, $A^2$, $B^1$ and $B^2$ may independently be a substituted or unsubstituted aromatic ring group, $R^{1a}$, $R^{2a}$, $R^{1b}$, $R^{2b}$, $R^{1c}$, $R^{2c}$, $R^{1d}$ and $R^{2d}$ may independently be fluorine, a hydroxy group, a substituted or unsubstituted aromatic ring group, or a combination thereof, and m and n may be integers of $0 \leq m \leq 200$ and $0 \leq n \leq 200$. The sum of the m and n may be at least 1.

The $A^1$, $A^2$, $B^1$ and $B^2$ may independently be a substituted or unsubstituted C6 to C50 arylene group.

The $A^1$, $A^2$, $B^1$ and $B^2$ may independently be one of the groups listed in the Group 1 and Group 2:

[Group 1]

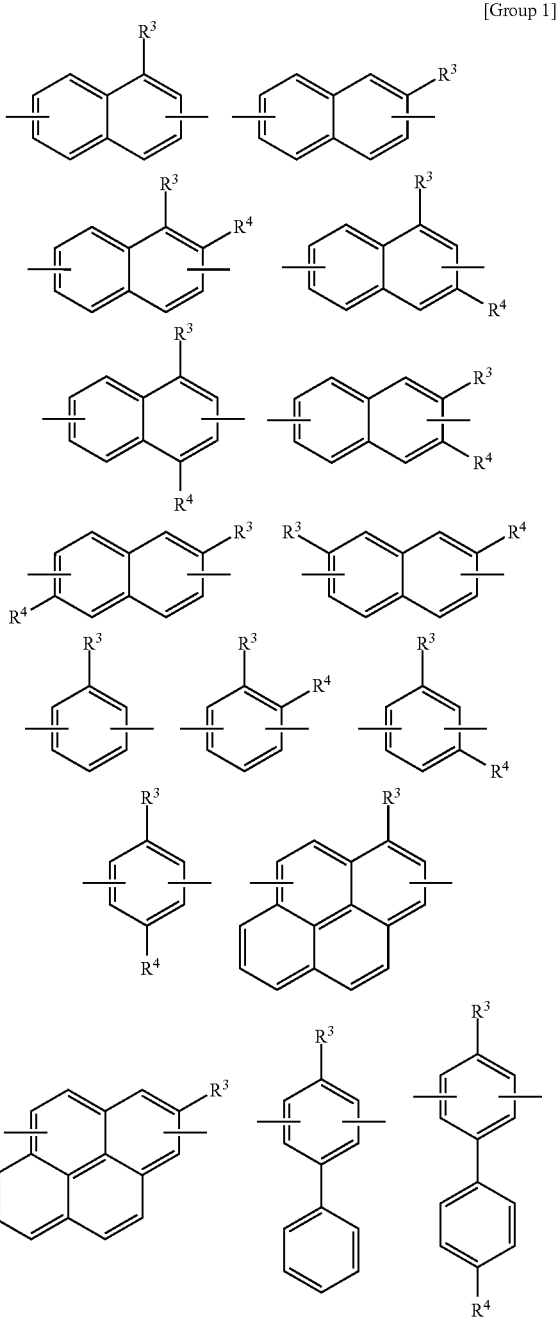

-continued

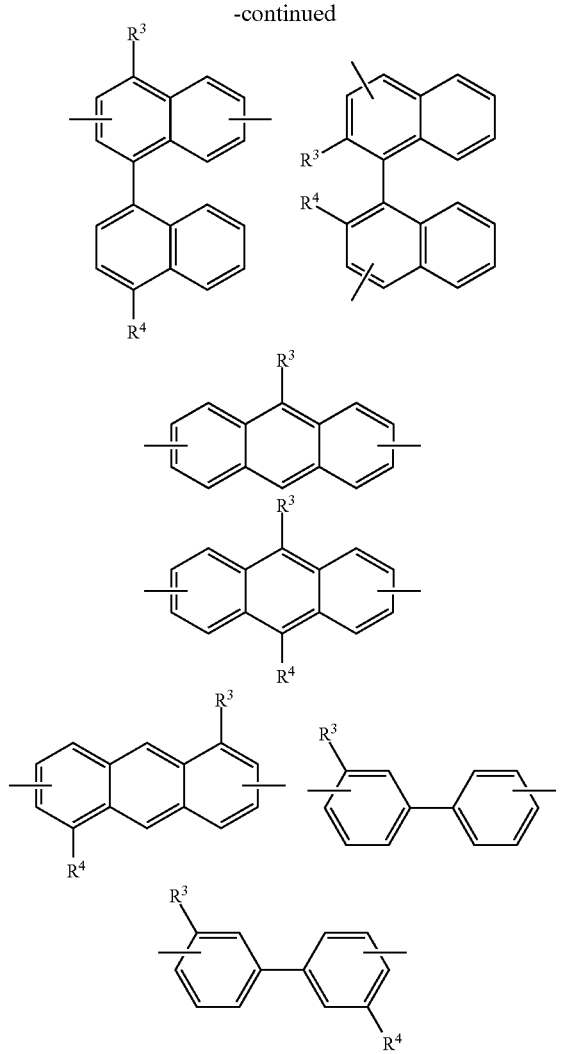

In the Group 1, $R^3$ and $R^4$ may independently be hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof,

[Group 2]

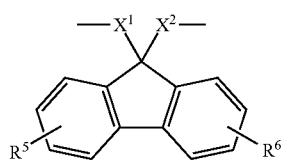

In the Group 2, $X^1$ and $X^2$ may independently be one of groups listed in the following Group 1, and $R^5$ and $R^6$ may independently be hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

At least one of $R^{1a}$, $R^{2a}$, $R^{1b}$, $R^{2b}$, $R^{1c}$, $R^{2c}$, $R^{1d}$ and $R^{2d}$ may be the substituted or unsubstituted aromatic ring group, the substituted or unsubstituted aromatic ring group being a substituted or unsubstituted naphthalene group, a substituted or unsubstituted phenyl group, a substituted or unsubstituted biphenyl group, a substituted or unsubstituted pyrene group, a substituted or unsubstituted binaphthalene group, a substituted or unsubstituted anthracene group, a substituted or unsubstituted fluorene group, or a combination thereof.

The polymer may have a weight average molecular weight of about 1.000 to about 200.000.

The polymer may be included in an amount of about 0.1 wt % to about 30 wt % based on the total weight of the organic layer composition.

At least one of $R^1$ and $R^2$ may be the substituted or unsubstituted aromatic ring group, the substituted or unsubstituted aromatic ring group being a substituted or unsubstituted naphthalene group, a substituted or unsubstituted phenyl group, a substituted or unsubstituted biphenyl group, a substituted or unsubstituted pyrene group, a substituted or unsubstituted binaphthalene group, a substituted or unsubstituted anthracene group, a substituted or unsubstituted fluorene group, or a combination thereof.

Embodiments are also directed to a method of forming patterns, the method including providing a material layer on a substrate, applying the hardmask composition according to an embodiment on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The hardmask composition may be applied using a spin-on coating method.

The hardmask layer may be formed by heat-treating at about 100° C. to about 500° C.

The method may further include forming a bottom anti-reflective coating (BARC) before forming the photoresist layer.

The silicon-containing thin layer may include silicon oxynitride (SiON).

BRIEF DESCRIPTION OF THE DRAWINGS

Features will become apparent to those of skill in the art by describing in detail example embodiments with reference to the attached drawings in which.

DETAILED DESCRIPTION

Figure 1:
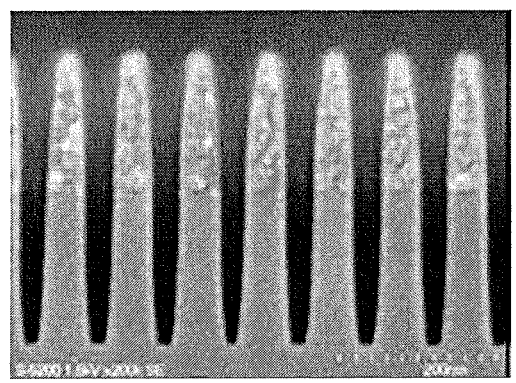
FIG. 1 illustrates an electron scanning microscope (SEM) photograph showing pattern characteristics of a hardmask layer manufactured in Example 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

As used herein, when a definition is not otherwise provided, the term 'substituted' may refer to one substituted with a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

As used herein, when a definition is not otherwise provided, indicates a linking point of a compound or a compound moiety.

Hereinafter, a hardmask composition according to an example embodiment is described.

A hardmask composition according to an example embodiment includes a polymer including a moiety represented by the following Chemical Formula 1 and a solvent.

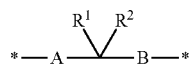

[Chemical Formula 1]

In the present example embodiment, in the Chemical Formula 1,

A and B are independently a substituted or unsubstituted aromatic ring group, and $R^1$ and $R^2$ are independently fluorine (—F), a phenyl group, a biphenyl group, a hydroxy group (—OH), a substituted or unsubstituted aromatic ring group, or a combination thereof.

The moiety represented by the Chemical Formula 1 includes two aromatic ring groups, and herein, hydrogen in an alkyl linker positioning among the aromatic ring groups is substituted with a group selected from fluorine (—F), a phenyl group, a biphenyl group, a hydroxy group (—OH), a substituted or unsubstituted aromatic ring group, or a combination thereof.

The functional groups have large binding energy but relatively small reactivity and may replace hydrogen bonded with $SP^3$ carbon of a polymer to prevent substitution with fluorine for the hydrogen bonded with $SP^3$ carbon during a bake process. Accordingly, wiggling characteristics or pattern collapse of a hardmask layer during a bake process even at a low temperature may be improved. Etching performance may also be improved by decreasing oxidizible sites during a bake process at a high temperature, and simultaneously, planarization characteristics may be improved by decreasing thermal contraction at a high temperature.

The polymer may include a plurality of moiety represented by the Chemical Formula 1, and the plurality of moiety may have the same structure or a different structure.

The A and B may independently be, for example, a substituted or unsubstituted C6 to C50 arylene group, for example, one of groups listed in the following Group 1 and Group 2.

[Group 1]

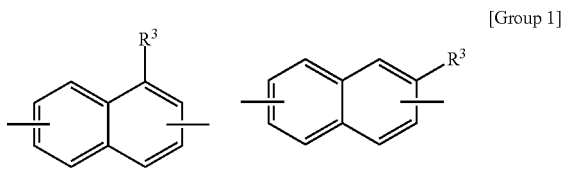

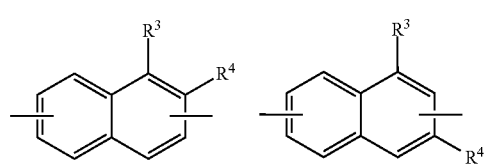

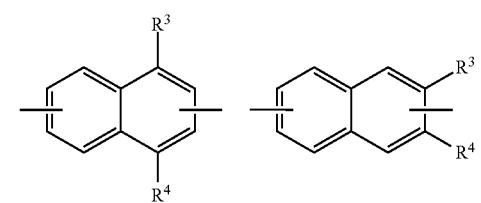

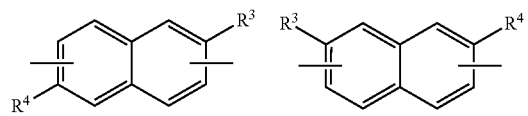

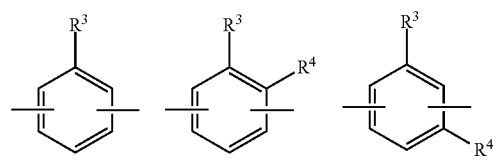

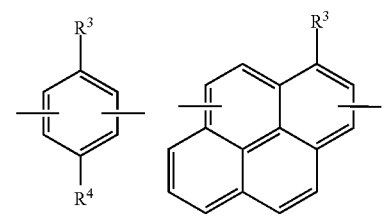

-continued

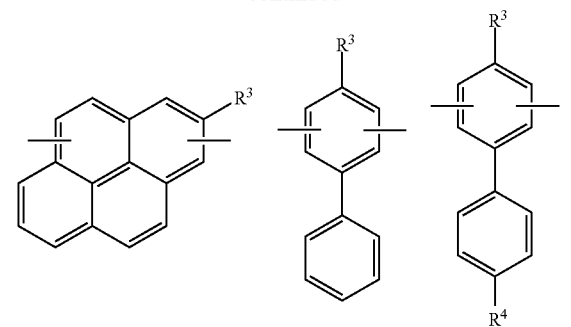

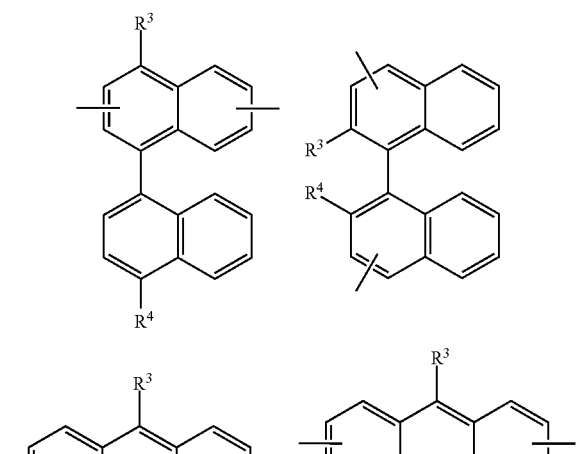

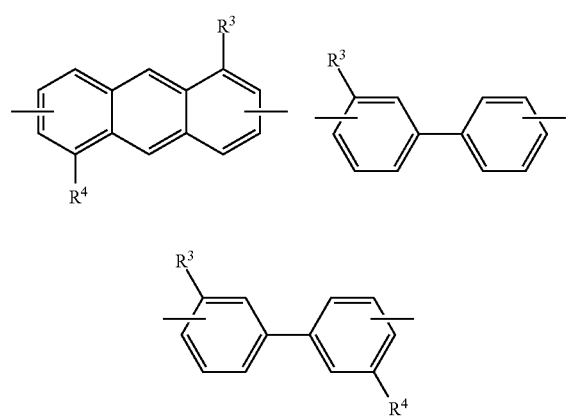

In the Group 1,

R³ and R⁴ are independently hydrogen (—H), a hydroxy group (—OH), a methoxy group (—OCH₃), an ethoxy group (—OC₂H₅), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

[Group 2]

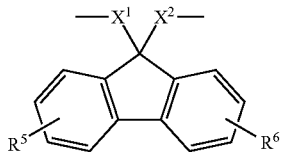

In the Group 2,

X¹ and X² are independently one of groups listed in the Group 1, and

R⁵ and R⁶ are independently hydrogen (—H), a hydroxy group (—OH), a methoxy group (—OCH₃), an ethoxy group (—OC₂H₅), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

For example, at least one of the A and B may be a substituted or unsubstituted polycyclic aromatic ring group, and the polycyclic aromatic ring group may be, for example, selected from the following Group 3.

[Group 3]

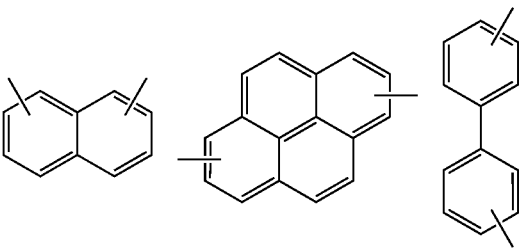

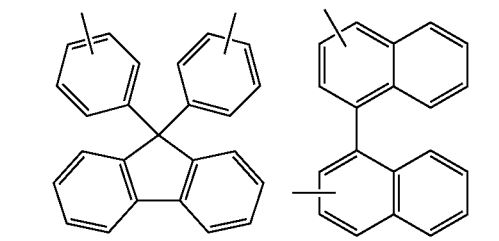

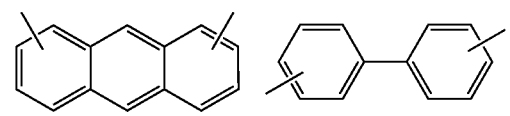

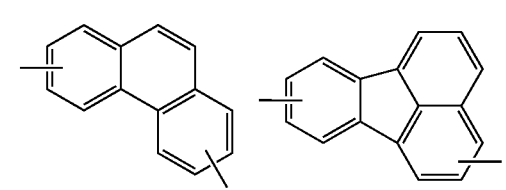

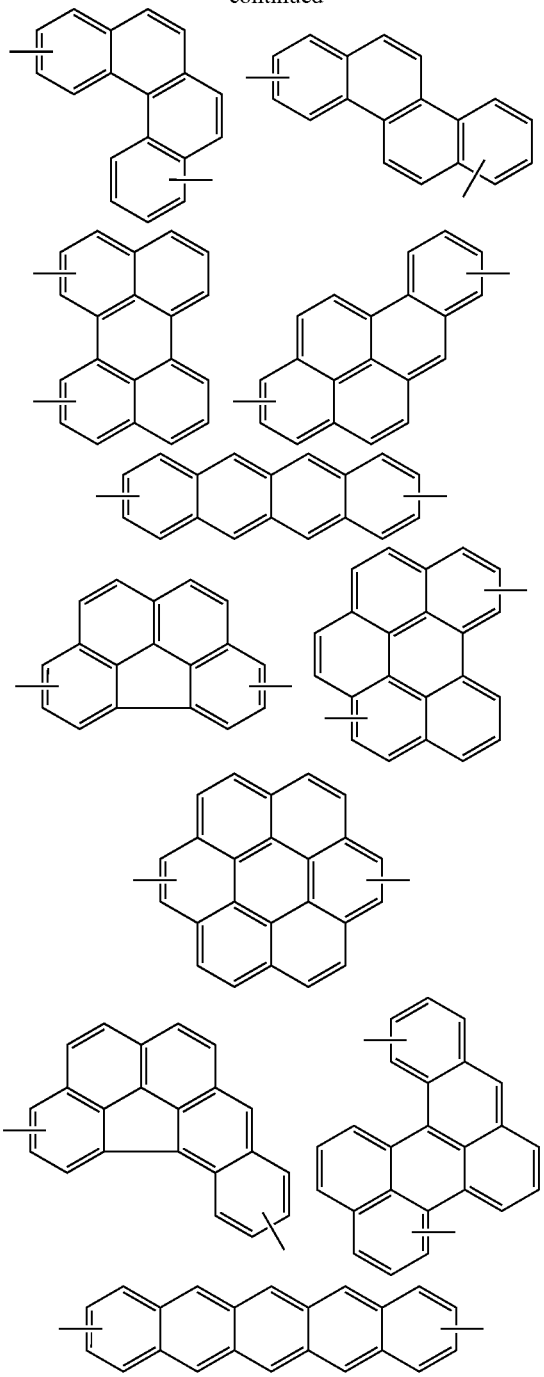

At least one hydrogen of the polycyclic aromatic group listed in the Group 3 may be substituted with a hydroxy group (—OH), a methoxy group (—OCH$_3$), an ethoxy group (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

For example, the polymer may be represented by the following Chemical Formula 2.

[Chemical Formula 2]

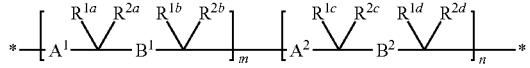

In the Chemical Formula 2, $A^1$, $A^2$, $B^1$ and $B^2$ are independently a substituted or unsubstituted aromatic ring group, $R^{1a}$, $R^{2a}$, $R^{1b}$, $R^{2b}$, $R^{1c}$, $R^{2c}$, $R^{1d}$ and $R^{2d}$ are independently fluorine (—F), a hydroxy group (—OH), a substituted or unsubstituted aromatic ring group, or a combination thereof, and m and n are integers of $0 \leq m \leq 200$ and $0 \leq n \leq 200$. The sum of m and n is at least 1.

For example, in the Chemical Formula 2, the $A^1$, $A^2$, $B^1$ and $B^2$ may be independently a substituted or unsubstituted C6 to C50 arylene group, for example, one of the groups listed in the Group 1 and Group 2, etc.

The polymer may have a weight average molecular weight of about 1,000 to about 200,000. When the polymer has a weight average molecular weight within the range, the carbon amount and solubility of a hardmask composition including the polymer may be adjusted and thus, optimized.

The solvent may be a suitable solvent dissolving or dispersing the polymer and may be, for example, at least one selected from propylene glycol. propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, methylpyrrolidone and acetylacetone.

The polymer may be included in an amount of about 0.1 to about 30 wt % based on the total weight of the organic layer composition. When the polymer is included in the range, a thickness, surface roughness and planarization of the organic layer may be controlled.

The hardmask composition may further include a surfactant.

The surfactant may include, for example, alkylbenzene sulfonate salt, alkyl pyridinium salt, polyethylene glycol, a quaternary ammonium salt, etc.

The surfactant may be included in an amount of about 0.001 to about 3 parts by weight based on 100 parts by weight of the hardmask composition. When the surfactant is included within the range, solubility may be improved without changing optical properties of the hardmask composition.

Hereafter, a method for forming patterns according to an example embodiment by using the hardmask composition according to an embodiment is described.

A method of forming patterns according to an example embodiment includes providing a material layer on a substrate, applying the hardmask composition including the polymer according to an embodiment and the solvent on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned, for example, a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hardmask composition is the same as described above, and may be applied by spin-on coating in a form of a solution. A thickness of the hardmask composition may be, for example, about 50 Å to about 10,000 Å.

The heat-treating the hardmask composition may be performed, for example, at about 100 to about 500° C. for about 10 seconds to 1 hour.

The silicon-containing thin layer may be formed of, for example, silicon nitride or silicon oxide.

The method may further include forming a bottom anti-reflective coating (BARC) before forming the photoresist layer.

Exposure of the photoresist layer may be performed using, for example, ArF, KrF, or EUV light. After exposure, heat treatment may be performed at about 100° C. to about 500° C.

The etching process of the exposed part of the material layer may be performed through a dry etching process using an etching gas and the etching gas may be, for example, $CHF_3$, $CF_4$, $Cl_2$, $BCl_3$, a mixed gas thereof, etc.

The etched material layer may be formed in a plurality of patterns, and the plurality of patterns may include one or more of a metal pattern, a semiconductor pattern, an insulation pattern, etc., for example, diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

Friedel-Crafts Acylation (Substituent-introducing Reaction)

20.2 g (0.1 mol) of terephthaloyl dichloride, 37.8 g (0.1 mol) of 9,9-bis(4-methoxyphenyl)-9H-fluorene and 232 g of 1,2-dichloroethane were put in a flask. Next, 13.2 g (0.1 mol) of aluminum chloride was slowly added to the solution, and the mixture was agitated at room temperature. Then, a sample was taken from the polymerization reactant every one hour to measure its weight average molecular weight, and when the weight average molecular weight reached 1,200 to 1,500, the reaction was terminated. When the reaction was terminated, methanol was added thereto, a monomer remaining after filtering a precipitate produced therein was removed by using water and methanol.

Fluorination 2.5 g (4.5 mmol) of a compound obtained from the substituent-introducing reaction, 2.2 g (9 mmol) of 4-tert-butyl-2,6-dimethylphenyl sulfurtrifluoride, 2 mL of HF-pyridine and 20 mL of dichloromethane were added in a flask in a dropwise fashion and then agitated at 50° C. for 24 hours. When the reaction was terminated, the reactant was cooled down to room temperature, an organic layer obtained therefrom was washed with a 5% hydrochloric acid solution and water, and a solvent remaining therein was removed, obtaining a compound represented by the following Chemical Formula A (a polymer with a weight average molecular weight=3,000).

[Chemical Formula A]

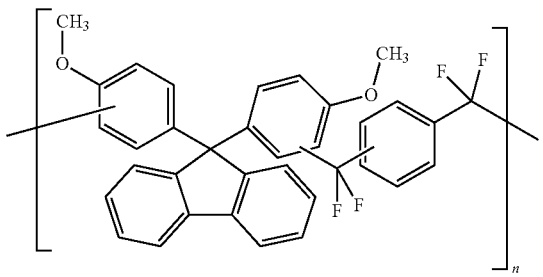

Synthesis Example 2

Friedel-Crafts Acylation (Substituent-Introducing Reaction)

20.2 g (0.1 mol) of terephthaloyl dichloride, 37.8 g (0.1 mol) of 9,9-bis(4-methoxyphenyl)-9H-fluorene and 232 g of 1,2-dichloroethane were put in a flask. Next, 13.2 g (0.1 mol) of aluminum chloride was slowly added to the solution, and the mixture was agitated at room temperature. Then, a sample was taken from the polymerization reactant every one hour to measure its weight average molecular weight, and when the weight average molecular weight was 1,200 to 1,500, the reaction was terminated. When the reaction was terminated, a monomer remaining after filtering a precipitate produced therein was removed with water and methanol.

Arylation (Introduction Reaction of Aromatic Group)

2 g of 2-bromo naphthalene was dissolved in 10 ml of tetrahydrofuran, and the solution was cooled down to −78° C. Next, 2.2 ml of n-BuLi (2.5 M) was added to the solution in a dropwise fashion, the mixture was agitated for 30 minutes, g of the compound obtained from the substituent-introducing reaction and dissolved in 2 ml of tetrahydrofuran was added thereto, and the mixture was agitated for 5 hours. When the reaction was terminated, the resultant was acidified with 1 N HCl and filtered, obtaining a compound represented by Chemical Formula B (a polymer with a weight average molecular weight=3,500).

[Chemical Formula B]

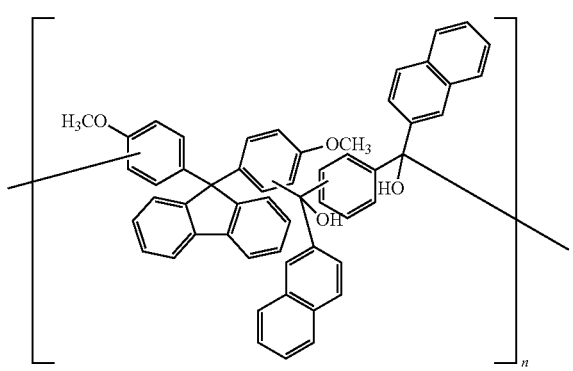

Synthesis Example 3

Friedel-Crafts Acylation (Substituent-Introducing Reaction)

A compound was synthesized according to the same method as Example 1 except for using 20.2 g (0.1 mol) of terephthaloyl dichloride, 11.6 g (0.05 mol) of 4-methoxypyrene, 7.9 g (0.05 mol) of methoxynaphthalene, 157 g of 1,2-dichloroethane and 13.2 g (0.1 mol) of aluminum chloride.

Fluorination

A compound represented by the following Chemical Formula C (a polymer with a weight average molecular weight=2,500) was obtained according to the same method as Example 1 by using 2 g of the compound obtained from the substituent-introducing reaction, 2.5 g (10 mmol) of 4-tert-butyl-2,6-dimethylphenyl sulfur trifluoride, 3 mL of HF-pyridine and 20 mL of dichloromethane.

its weight average molecular weight, and when the weight average molecular weight reached 1,800 to 2,300, the reaction was terminated.

When the reaction was terminated, the resultant was cooled down to room temperature and then 40 g of distilled water and 400 g of methanol were added thereto, and the mixture was strongly agitated and then allowed to stand. After removing a supernatant therefrom, a precipitate therein was dissolved in 80 g of propylene glycol monomethyl ether acetate (PGMEA), and the solution was strongly agitated by using 40 g of methanol and 40 g of water and then allowed to stand (First process). A supernatant was removed, and a precipitate remaining therein was dissolved in 40 g of propylene glycol monomethyl ether acetate (PGMEA) (Second process). The first and second processes were regarded as one purification process, and this purification process was performed three times in total. The purified polymer was dissolved in 80 g of propylene glycol monomethyl ether acetate (PGMEA), and the solution was decompressed to remove methanol and distilled water, obtaining a compound represented by Chemical Formula D (a polymer with a weight average molecular weight=2500).

[Chemical Formula D]

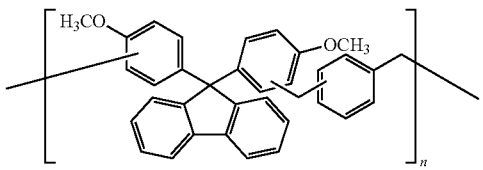

[Chemical Formula C]

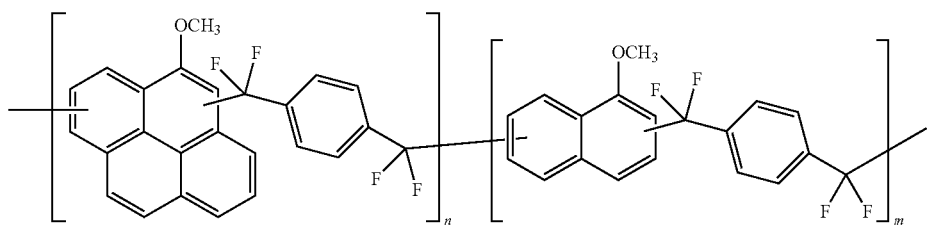

Comparative Synthesis Example 1

21.6 g (0.057 mol) of 9,9-bis(4-methoxyphenyl)-9H-fluorene and 9.6 g (0.057 mol) of 1,4-bis(methoxymethyl)benzene were sequentially put in a 500 ml flask equipped with a thermometer, a condenser and a mechanical agitator and dissolved in 51 g of propylene glycol monomethyl ether acetate (PGMEA). Next, 0.15 g (0.001 mol) of diethyl sulfite was added thereto, and the mixture was agitated at 90 to 120° C. for 5 to 10 hours or so. Then, a sample was taken from the polymerization reactant every one hour to measure

Comparative Synthesis Example 2

A compound represented by the following Chemical Formula E (a polymer with a weight average molecular weight=2500) was obtained according to the same method as Comparative Example 1 by using 23.2 g (0.1 mol) of 4-methoxypyrene, 33.2 g (0.2 mol) of 1,4-bis(methoxymethyl)benzene, 15.8 g (0.1 mol) of 1-methoxynaphthalene, 72.2 g of propylene glycol monomethyl ether acetate (PGMEA) and 0.62 g (4 mmol) of diethylsulfate.

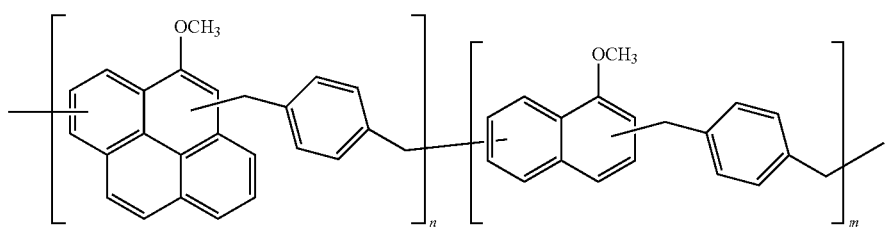

[Chemical Formula E]

Preparation of Hardmask Composition

Example 1

A hardmask composition was prepared by dissolving the compound according to Synthesis Example 1 in a mixed solvent of propylene glycolmonomethyl ether acetate (PGMEA) and cyclohexanone (7:3 (v/v)) and filtering the solution. The compound was used in an amount of 3 to 13 wt % based on the total weight of the hardmask composition depending on a desired thickness.

Example 2

A hardmask composition was prepared according to the same method as Example 1 except for using the compound of Synthesis Example 2 instead of the compound of Synthesis Example 1.

Example 3

A hardmask composition was prepared according to the same method as Example 1 except for using the compound of Synthesis Example 3 instead of the compound of Synthesis Example 1.

Comparative Example 1

A hardmask composition was prepared according to the same method as Example 1 except for using the compound of Comparative Synthesis Example 1 instead of the compound of Synthesis Example 1.

Comparative Example 2

A hardmask composition was prepared according to the same method as Example 1 except for using the compound of Comparative Synthesis Example 2 instead of the compound of Synthesis Example 1.

Evaluation

Evaluation 1: Etch Resistance

Each hardmask composition according to Examples 1 to 3 and Comparative Examples 1 and 2 was spin-on coated to form a 4,000 Å thick thin film on a silicon wafer and then heat-treated on a hot plate at 400° C. for 2 minutes. Subsequently, the thickness of the thin film was measured. Then, the thin film was dry etched by using a $CHF_3/CF_4$ mixed gas and a $N_2/O_2$ mixed gas respectively for 100 seconds and 60 seconds, and then the thickness of the thin film was measured again. The thicknesses of the thin film before and after the dry etching and its etching time were used to calculate bulk etch rate (BER) according to the following Calculation Equation 1.

(initial thickness of thin film−thickness of thin film after etching)/etching time (Å/s)  [Calculation Equation 1]

The results are provided in Table 1.

TABLE 1

| | Bulk etch rate (Å/sec) | |
|---|---|---|
| | $CHF_3/CF_4$ mixed gas | $N_2/O_2$ mixed gas |
| Example 1 | 24.3 | 25.2 |
| Example 2 | 23.4 | 23.5 |
| Example 3 | 23.1 | 24.1 |
| Comparative Example 1 | 30.2 | 28.4 |
| Comparative Example 2 | 29.3 | 27.6 |

Referring to Table 1, the thin films respectively formed of the hardmask compositions according to Examples 1 to 3 showed sufficient etch resistance to etching gas and thus exhibited improved bulk etch characteristics compared with the thin films respectively formed of the hardmask compositions according to according to Comparative Examples 1 and 2.

Evaluation 2: Pattern Formation

Each hardmask composition according to Examples 1 to 3 and Comparative Examples 1 and 2 was spin-on coated to form hardmask layer on a silicon wafer and then heat-treated on a hot plate at 300° C. for 3 minutes. Subsequently, a 300 Å-thick silicon nitride (SiN) layer was formed in a chemical vapor deposition (CVD) method, a photoresist for KrF was coated thereon, and the product was heat-treated at 110° C. for 60 seconds and then exposed by using an ASML (XT: 1400, NA 0.93) exposure equipment and developed with tetramethyl ammonium hydroxide (a 2.38 wt % TMAH aqueous solution). Subsequently, the silicon nitride layer was dry-etched by using a $CHF_3/CF_4$ mixed gas, and then the hardmask layer was dry-etched by using a $N_2/O_2$ mixed gas. Then, a pattern profile formed thereon was examined by using an electron scanning microscope (SEM).

Figure 2:
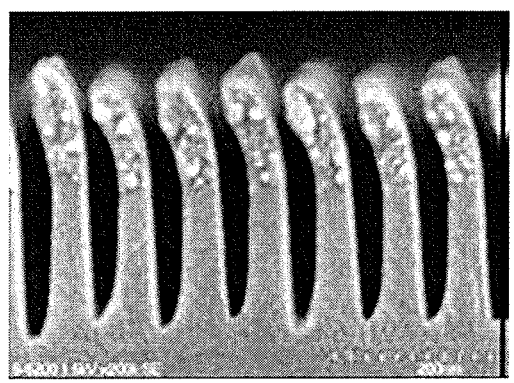
FIG. 2 illustrates an electron scanning microscope (SEM) photograph showing pattern characteristics of a hardmask layer manufactured in Comparative Example 2.

The results are provided in Table 2 and FIGS. 1 and 2.

TABLE 2

| | Wiggling Generation |
|---|---|
| Example 1 | None |
| Example 2 | None |
| Example 3 | None |
| Comparative Example 1 | Yes |
| Comparative Example 2 | Yes |

Referring to Table 2, the thin films respectively formed of the hardmask compositions according to Examples 1 to 3 showed no wiggling in a low temperature process, while the patterns respectively formed of the hardmask compositions according to Comparative Examples 1 and 2 showed wiggling.

FIGS. 1 and 2 are electron scanning microscope (SEM) photographs showing pattern characteristics of each hardmask layers according to Example 1 and Comparative Example 2.

Referring to FIGS. 1 and 2, the cross section of the pattern formed of the hardmask composition according to Example 1 showed less wiggling than the cross section of the pattern formed of the hardmask composition according to Comparative Example 2.

By way of summation and review, it maybe difficult to form a fine pattern having an excellent profile using a general lithographic technique. Accordingly, a layer, called a hardmask layer, may be formed between the material layer and the photoresist layer to provide a fine pattern. The hardmask layer plays a role of an intermediate layer for transferring the fine pattern of photoresist to the material layer through the selective etching process. Accordingly, the hardmask layer is desired to have characteristics such as heat resistance, etch resistance, and the like to tolerate multiple etching processes.

Also, forming a hardmask layer by a spin-on coating method instead of a chemical vapor deposition has been considered. The spin-on coating method may be easier to perform, and may also improve gap-fill characteristics and planarization characteristics. The gap-fill characteristics of filling a pattern with a layer without a space are important when multiple patterns are used to realize a fine pattern. In addition, the planarization characteristics of planarizing the surface of the layer with a lower layer are important when a substrate has a bump, or a wafer (as the substrate) has a pattern-dense region and a no-pattern region.

As described above, embodiments may provide a hardmask composition that provides etch resistance and planarization characteristics simultaneously.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:
   a polymer represented by the following Chemical Formula 2:

[Chemical Formula 2]

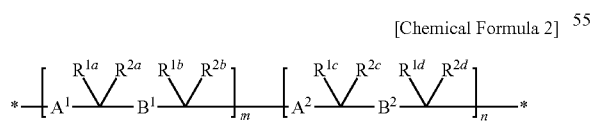

wherein, in Chemical Formula 2,
   $A^1$, $A^2$, $B^1$ and $B^2$ are independently a substituted or unsubstituted aromatic ring group,
   $R^{1a}$, $R^{2a}$, $R^{1b}$, $R^{2b}$, $R^{1c}$, $R^{2c}$, $R^{1d}$ and $R^{2d}$ are independently fluorine, a hydroxy group, a substituted or unsubstituted aromatic ring group, or a combination thereof, and
   m and n are integers of $0 \leq m \leq 200$ and $0 \leq n \leq 200$, provided that the sum of the m and n is at least 1; and
   a solvent.

2. The hardmask composition as claimed in claim 1, wherein the $A^1$, $A^2$, $B^1$ and $B^2$ are independently a substituted or unsubstituted C6 to C50 arylene group.

3. The hardmask composition as claimed in claim 1, wherein the $A^1$, $A^2$, $B^1$ and $B^2$ are independently one of the groups listed in the Group 1 and Group 2:

[Group 1]

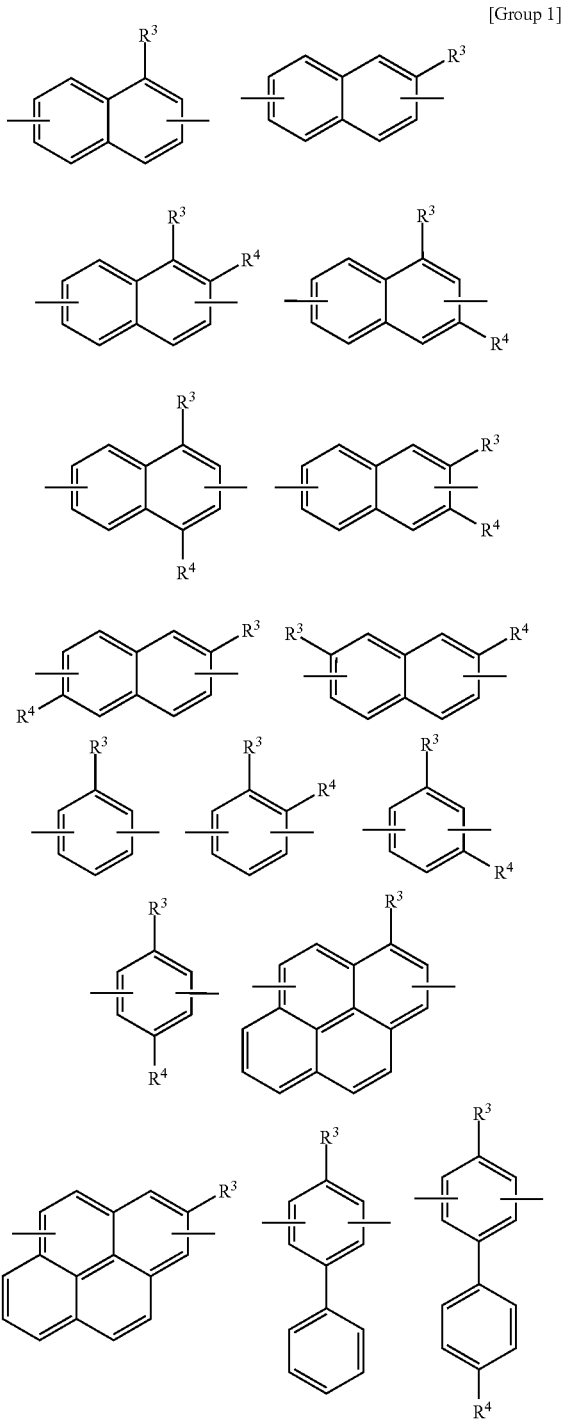

-continued

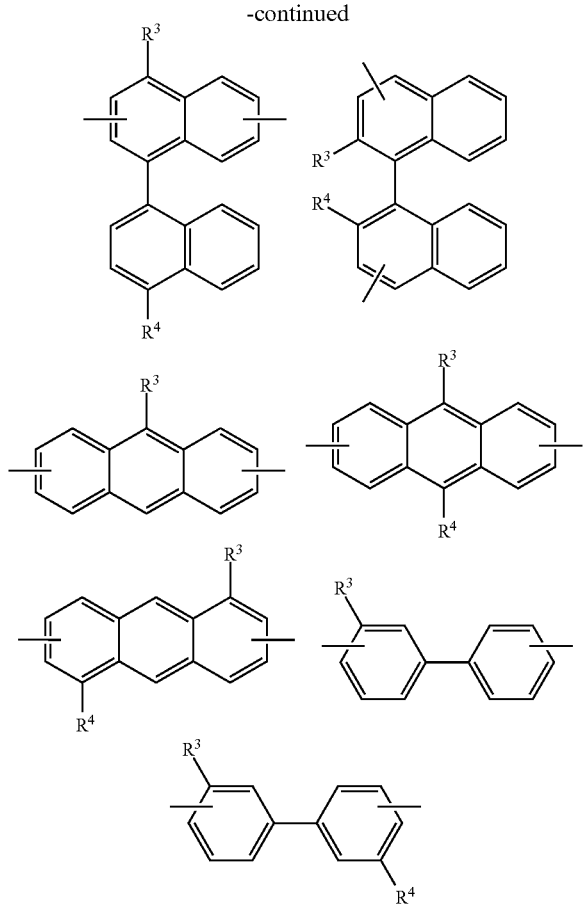

wherein in the Group 1,

R³ and R⁴ are independently hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof,

[Group 2]

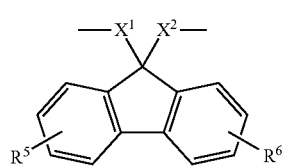

wherein in the Group 2, $X^1$ and $X^2$ are independently one of groups listed in the following Group 1, and $R^5$ and $R^6$ are independently hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

4. The hardmask composition as claimed in claim 1, wherein at least one of $R^{1a}$, $R^{2a}$, $R^{1b}$, $R^{2b}$, $R^{1c}$, $R^{2c}$, $R^{1d}$ and $R^{2d}$ is the substituted or unsubstituted aromatic ring group, the substituted or unsubstituted aromatic ring group being a substituted or unsubstituted naphthalene group, a substituted or unsubstituted phenyl group, a substituted or unsubstituted biphenyl group, a substituted or unsubstituted pyrene group, a substituted or unsubstituted binaphthalene group, a substituted or unsubstituted anthracene group, a substituted or unsubstituted fluorene group, or a combination thereof.

5. The hardmask composition as claimed in claim 1, wherein the polymer has a weight average molecular weight of about 1,000 to about 200,000.

6. The hardmask composition as claimed in claim 1, wherein the polymer is included in an amount of about 0.1 wt % to about 30 wt % based on the total weight of the organic layer composition.

7. A method of forming patterns, the method comprising:
providing a material layer on a substrate;
applying the hardmask composition as claimed in claim 1 on the material layer;
heat-treating the hardmask composition to form a hardmask layer;
forming a silicon-containing thin layer on the hardmask layer;
forming a photoresist layer on the silicon-containing thin layer;
exposing and developing the photoresist layer to form a photoresist pattern;
selectively removing the silicon-containing thin layer and the hardmask layer using the photoresist pattern to expose a part of the material layer; and
etching an exposed part of the material layer.

8. The method as claimed in claim 7, wherein the hardmask composition is applied using a spin-on coating method.

9. The method as claimed in claim 7, wherein the hardmask layer is formed by heat-treating at about 100° C. to about 500° C.

10. The method as claimed in claim 7, further comprising forming a bottom antireflective coating (BARC) before forming the photoresist layer.

11. The method as claimed in claim 7, wherein the silicon-containing thin layer includes silicon oxynitride (SiON).

* * * * *